United States Patent
Lee et al.

(10) Patent No.: US 7,119,549 B2
(45) Date of Patent: Oct. 10, 2006

(54) OUTPUT CALIBRATOR WITH DYNAMIC PRECISION

(75) Inventors: Kueck Hock Lee, Milpitas, CA (US); Andy Peng-Pui Chan, Saratoga, CA (US)

(73) Assignee: Rambus Inc., Los Altos, CA (US)

( * ) Notice: Subject to any disclaimer, the term of this patent is extended or adjusted under 35 U.S.C. 154(b) by 149 days.

(21) Appl. No.: 10/374,957

(22) Filed: Feb. 25, 2003

(65) Prior Publication Data

US 2004/0165693 A1    Aug. 26, 2004

(51) Int. Cl.
*G01R 35/00* (2006.01)
(52) U.S. Cl. .................................. 324/601; 702/117
(58) Field of Classification Search .................. 702/57, 702/64, 117, 118, 124, 189; 324/601; 327/51, 327/57, 78, 82, 83, 87
See application file for complete search history.

(56) References Cited

U.S. PATENT DOCUMENTS

| | | | |
|---|---|---|---|
| 3,646,329 A | 2/1972 | Yoshino et al. ............... 326/36 |
| 4,192,005 A | 3/1980 | Kurtz ........................... 702/98 |
| 4,315,210 A | 2/1982 | Michel et al. ............... 324/612 |
| 4,329,600 A | 5/1982 | Stewart ........................ 361/89 |
| 4,414,480 A | 11/1983 | Zasio ........................... 326/30 |
| 4,481,625 A | 11/1984 | Roberts et al. | |
| 4,549,124 A | 10/1985 | Beier ........................... 318/663 |
| 4,680,487 A | 7/1987 | Kobayashi .................... 326/87 |
| 4,691,127 A | 9/1987 | Huizer ......................... 326/82 |
| 4,707,620 A | 11/1987 | Sullivan et al. ............... 326/86 |
| 4,715,003 A | 12/1987 | Keller et al. ................. 702/98 |
| 4,719,369 A | 1/1988 | Asano et al. ................. 326/30 |
| 4,728,881 A | 3/1988 | Evans et al. ................. 323/353 |
| 4,765,188 A | 8/1988 | Krechmery et al. ........... 73/708 |
| 4,779,013 A | 10/1988 | Tanaka ........................ 326/27 |
| 4,859,877 A | 8/1989 | Cooperman et al. ........... 326/30 |
| 4,860,198 A | 8/1989 | Takemaka .................... 710/307 |
| 4,894,562 A | 1/1990 | Cavaliere et al. ............ 326/126 |
| 4,939,389 A | 7/1990 | Cox et al. ..................... 326/86 |
| 4,958,520 A | 9/1990 | Trommler et al. ............. 73/727 |
| 4,967,105 A | 10/1990 | Akamatsu et al. ............ 326/87 |
| 4,977,333 A | 12/1990 | Suzuki et al. ................ 327/408 |
| 4,992,724 A | 2/1991 | Hisanaga et al. ............ 323/367 |
| 5,023,488 A | 6/1991 | Gunning et al. ............... 326/86 |

(Continued)

FOREIGN PATENT DOCUMENTS

EP    0482392 A2    2/1991

(Continued)

OTHER PUBLICATIONS

Sasaki, H., et al., "High Precision Automated Resistance Measurement Using A Modified Wheatstone Bridge," CPEM '88 Digest, Japan, 1988, 1 page.

(Continued)

*Primary Examiner*—Timothy P. Callahan
*Assistant Examiner*—Cassandra Cox
(74) *Attorney, Agent, or Firm*—Vierra Magen Marcus & DeNiro LLP

(57) ABSTRACT

An integrated circuit device having an output driver circuit and a control circuit. The output driver circuit outputs a first signal having a signal level according to a control value. The control circuit is coupled to receive the first signal from the output driver and adjusts the control value by a first increment until a transition event is detected. After the transition event is detected, the control circuit adjusts the control value by a second increment, the second increment being smaller than the first increment.

22 Claims, 8 Drawing Sheets

U.S. PATENT DOCUMENTS

| | | | | |
|---|---|---|---|---|
| 5,024,101 | A | 6/1991 | Tanaka et al. | 73/766 |
| 5,045,730 | A | 9/1991 | Cooperman et al. | 326/73 |
| 5,045,832 | A | 9/1991 | Tam | 338/334 |
| 5,055,715 | A | 10/1991 | Inaba | 326/16 |
| 5,075,569 | A | 12/1991 | Branson | 327/108 |
| 5,081,379 | A | 1/1992 | Korteling | 327/50 |
| 5,097,148 | A | 3/1992 | Gabara | 326/86 |
| 5,107,230 | A | 4/1992 | King | 326/86 |
| 5,117,130 | A | 5/1992 | Shoji | 524/60 |
| 5,118,971 | A | 6/1992 | Schenck | 326/32 |
| 5,121,064 | A | 6/1992 | Eller | 324/601 |
| 5,134,311 | A | 7/1992 | Biber et al. | 327/108 |
| 5,165,046 | A | 11/1992 | Hesson | 327/111 |
| 5,185,538 | A | 2/1993 | Kondoh et al. | 327/109 |
| 5,194,765 | A | 3/1993 | Dunlop et al. | 326/87 |
| 5,206,546 | A | 4/1993 | Usami | 326/110 |
| 5,237,214 | A | 8/1993 | Usami | 326/110 |
| 5,254,883 | A | 10/1993 | Horowitz et al. | 307/443 |
| 5,296,756 | A | 3/1994 | Patel et al. | 326/21 |
| 5,387,824 | A | 2/1995 | Michelsen | 326/83 |
| 5,457,407 | A | 10/1995 | Shu et al. | 326/30 |
| 5,546,042 | A | 8/1996 | Tedrow et al. | 327/538 |
| 5,568,068 | A | 10/1996 | Ota et al. | 326/82 |
| 5,578,940 | A | 11/1996 | Dillon et al. | |
| 5,596,285 | A | 1/1997 | Marbot et al. | 326/30 |
| 5,742,798 | A | 4/1998 | Goldrian | |
| 5,778,419 | A | 7/1998 | Hansen et al. | |
| 5,838,177 | A | 11/1998 | Keeth | 327/108 |
| 5,977,797 | A | 11/1999 | Gasparik | 326/86 |
| 6,009,487 | A | 12/1999 | Davis et al. | |
| 6,072,747 | A | 6/2000 | Yoon | 365/230.06 |
| 6,094,075 | A | 7/2000 | Garrett, Jr. et al. | 327/100 |
| 6,310,814 | B1 | 10/2001 | Hampel et al. | 365/222 |
| 6,313,670 | B1 | 11/2001 | Song et al. | 327/108 |
| 6,442,644 | B1 | 8/2002 | Gustavson et al. | 711/105 |
| 6,462,588 | B1 | 10/2002 | Lau et al. | 327/108 |
| 6,546,343 | B1 | 4/2003 | Batra et al. | 702/64 |

FOREIGN PATENT DOCUMENTS

| | | |
|---|---|---|
| JP | 63-276935 | 11/1988 |
| JP | 03-087907 | 4/1991 |
| JP | 04-117709 | 4/1992 |
| JP | 02000035831 A | 2/2000 |

OTHER PUBLICATIONS

Sasaki, H., et al.,"Measurement of the Pressure Dependence of Standard Resistors Using A Modified Wheatstone Bridge," Trans. IEE of Japan, vol. 109, No. 1/2,Jan./Feb. 1989, 6 pages.

Sasaki, H., et al., "Automated Measurement System for 1-.OMEGA.Standard Resistors Using A Modified Wheatstone Bridge," IEEE Trans. on Instr. and Measurement, vol. 40, No. 2, Apr. 1991, p. 274-277.

Sasaki, H., et al., "A Modified Wheatstone Bridge for High-Precision Automated Resistance Measurement," IEEE Trans. on Instr. and Measurement, vol. 26, No. 2, Dec. 1987, p. 947-949.

Armstrong, David H., "Pitfalls in Testing Digital ASIC Devices," IEEE 1987 Custom Integrated Circuits Conference, pp. 573-578.

Mathews, John W. and Erdelyi, Charles K. "Power Supply Votages for Future VLSI," IEEE 1986 Custom Integrated Circuits Conference, pp. 149-152.

Gillingham, Peter, MOSAID Technologies, Inc., "SLDRAM Architectural and Functional Overview", 1997 SLDRAM Consortium, Aug. 29, 1997, pp. 1-14.

Gillingham, Peter, and Vogley, Bill, "SLDRAM" High-Performance, Open-Standard Memory, 1997 IEEE, Nov./Dec. 1997, pp. 29-39.

Draft 0.99 IEEE P1596.7-199X, "Draft Standard for A High-Speed Memory Interface (SyncLink)", Oct. 14, 1996 IEEE.

Gabara et al., "Digitally Adjustable Resistors in CMOS for High-Performance Applications", IEEE Journal of Solid-State Circuits, vol. 27, No. 8, Aug. 1992.

Reynolds, C.B., "Analysis and Guidelines for High-Speed VLSI System Interconnections," IEEE 1988 Custom Integrated Circuits Conference, pp. 23.5.1-23.5.4.

Leung, Kam, "Controlled Slew Rate Output Buffer," IEEE 1988 Custom Integrated Circuits Conference, pp. 5.5.1-5.5.4.

Knight, Thomas F. Jr., and Krymm, Alexander, "A Self-Terminating Low-Voltage Swing CMOS Output Driver," Journal of Solid State Circuits, vol. 23, No. 2, Apr. 1998, pp. 457-464.

Cox, Dennis T., et al.,"VLSI Performance Compensation for Off-Chip Drivers and Clock Generation," IEEE 1989 Custom Integrated Circuits Conf., pp. 14.3.1-14.3.4.

Douseki, Takakuni and Ohmori, Yasuo, "BICMOS Circuit Technology for a High-Speed SRAM," IEEE Journal of Solid-State Circuits, vol. 23, No. 1, Feb. 1988, pp. 68-73.

"Driver with Noise-Dependent Switching Speed Control," IBM Technical Disclosure Bulletin, vol. 29, No. 3, Aug. 1986, IBM Corporation, pp. 1243-1244.

Biber, Alice I. "The Design of an Application Specific Interface Drive for a High Capacitive Load," Masters Thesis at the Massachusetts Inst. of Technology, Dec. 1989.

Raver, Norman, "Open-Loop Gain Limitations for Push-Pull Off-Chip Drivers," Journal of Solid-State Circuits, vol. SC-22, No. 2, Apr. 1987, pp. 145-150.

Senbon, T. and Hanabuchi, F., Instrumentation Systems: Fundamentals and Applications, Chapter 3: Detection and Conversion of Industrial Variables; 1991, 11 pages.

Johnson, C. and Richeh, H, "Highly Accurate Resistance Deviation to Frequency Converter with Programmable Sensitivity and Resolution," IEEE vol. IM-35, No. 2, Jun. 1986, 4 pages.

FIG. 11

48 > TARGET CALIBRATION VALUE > 47

| INTERVAL | C[7:0] | | DIR | PC[7:0] |
|---|---|---|---|---|
| 1 | 0000 0000 | (0d) | X | 1000 0000 |
| 2 | 1000 0000 | (128d) | 0 | 1100 0000 |
| 3 | 0100 0000 | (64d) | 0 | 1110 0000 |
| 4 | 0010 0000 | (32d) | 1 | 1111 0000 |
| 5 | 0011 0000 | (48d) | 0 | 1111 1000 |
| 6 | 0010 1000 | (40d) | 1 | 1111 1100 |
| 7 | 0010 1100 | (44d) | 1 | 1111 1110 |
| 8 | 0010 1110 | (46d) | 1 | 1111 1111 |
| 9 | 0010 1111 | (47d) | 1 | 1111 1111 |
| 10 | 0011 0000 | (48d) | 0 | 1111 1111 |
| 11 | 0011 1111 | (47d) | 0 | 1111 1111 |

OUTPUT CALIBRATOR WITH DYNAMIC PRECISION

FIELD OF THE INVENTION

The present invention relates generally to signaling systems, and more particularly to output driver calibration in high speed signaling systems.

BACKGROUND

Output calibrators are used to calibrate signaling levels in high-speed signaling systems. Through calibration, signal level variations resulting from changes in process, voltage and temperature can be reduced, increasing signaling margins and enabling higher signaling rates.

FIG. 1 illustrates a prior art signaling system 100 having a variable-strength output driver 101 and an output calibrator 103. The output calibrator 103 includes a compare circuit 105 to compare a data signal (DATA) generated by the output driver 101 with a reference signal, $V_{REF}$, and a counter 107 that is incremented or decremented according to the comparison result. The count value maintained within the counter (CNT) is output to the output driver 101 to control the voltage level of the data signal. Thus, the output calibrator 103 constitutes a feedback circuit that increases or decreases the data signal level as necessary to reduce the difference between the data signal level and the reference signal level.

FIG. 2 illustrates a sequence of calibration operations used to adjust the count value, and therefore the data signal level, in the system of FIG. 1. Initially, the count value is set to a midpoint value $2^{N-1}$ to divide the search range for the target signal level (TSL) in half. In the example shown, the target signal level corresponds to a count value that is above the initial count value so that each initial calibration operation results in a stepwise increment of the count value until, X calibration operations later, a count value of $2^{N-1}+X$ is reached. At this count value, the data signal level exceeds the target signal level, so that the count value is decremented in the next calibration operation, and the calibration operations thereafter produce in a stepwise dithering about the target signal level.

As signal amplitudes and bit times shrink to achieve the ever-higher signaling rates demanded by modern computing and electronics applications, the level of precision needed in signal calibration operations increases. Referring to FIG. 2, it can be seen that the precision of the signal calibration is limited by the quantization error inherent in a stepwise increment of the count value, the worst case quantization error (QE) being equal to the signal level increment resulting from a single step of the count value. Accordingly, one direct way to increase calibration precision is to increase the resolution of the count value and the incremental drive strength adjustment in the output driver, thereby reducing the worst case quantization error within the output calibrator. Unfortunately, each additional bit of resolution within the count value doubles the size of the search range for the target signal level and therefore substantially increases the time required to achieve convergence (i.e., to reach the dither condition). This is particularly problematic in modern computing systems, where timing budgets for initialization operations are being squeezed to reduce boot times. Also, because each stepwise calibration operation is typically performed in response to one or more calibration commands from a programmed control device, increasing the calibration precision typically involves modifying system programming to increase the number of initial calibration commands. Such modifications make legacy support for lower-precision devices difficult, limiting device interchangeability and complicating hybrid systems that include both higher- and lower-precision devices.

BRIEF DESCRIPTION OF THE DRAWINGS

The present invention is illustrated by way of example, and not by way of limitation, in the figures of the accompanying drawings and in which like reference numerals refer to similar elements and in which:

FIG. 11 illustrates a binary search for a target calibration value using the variable-precision counter of FIG. 10.

DETAILED DESCRIPTION

Figure 1:
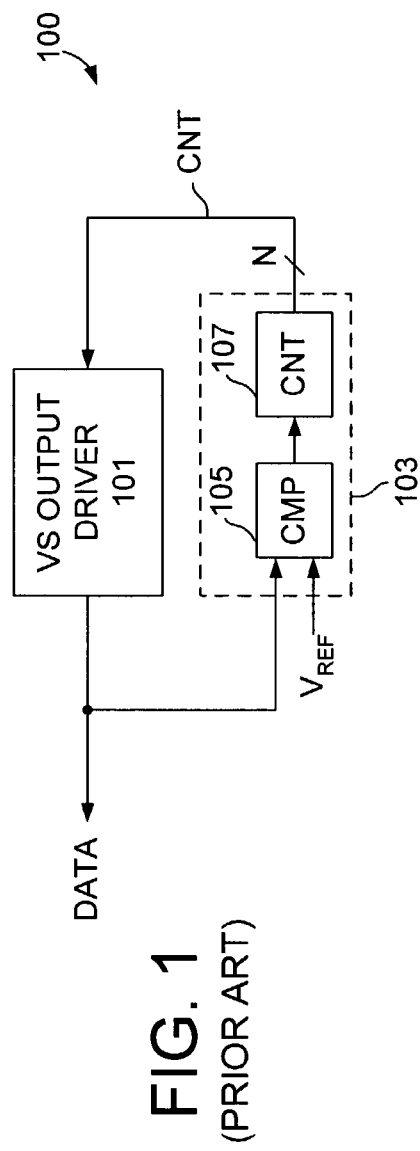
FIG. 1 illustrates a prior art signaling system having a variable-strength output driver and an output calibrator.
Figure 2:
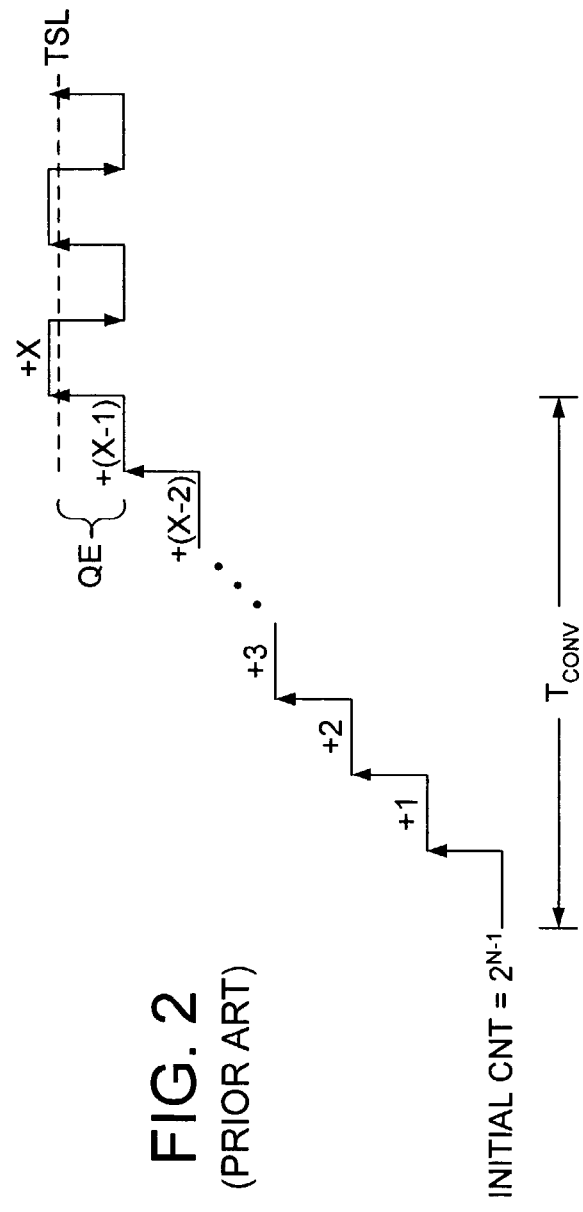
FIG. 2 illustrates a sequence of calibration operations used to adjust the data signal level in the system of FIG. 1.

In the following description and in the accompanying drawings, specific terminology and drawing symbols are set forth to provide a thorough understanding of the present invention. In some instances, the terminology and symbols may imply specific details that are not required to practice the invention. For example, the interconnection between circuit elements or circuit blocks may be shown or described as multi-conductor or single conductor signal lines. Each of the multi-conductor signal lines may alternatively be single-conductor signal lines, and each of the single-conductor signal lines may alternatively be multi-conductor signal lines. Signals and signaling paths shown or described as being single-ended may also be differential, and vice-versa. Similarly, signals described or depicted as having active-high or active-low logic levels may have opposite logic levels in alternative embodiments. As another example, circuits described or depicted as including metal oxide semiconductor (MOS) transistors may alternatively be implemented using bipolar technology or any other technology in which a signal-controlled current flow may be achieved. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal.

An output calibrator with dynamic precision is disclosed herein in various embodiments. In one embodiment, the output calibrator is initially operated in a coarse-precision mode, then switched to a fine-precision mode upon detecting a transition in a search direction signal. In coarse-precision mode, the output calibrator adjusts a calibration value by a coarse step value during each calibration operation, incrementing or decrementing the calibration value depending on the state of the search direction signal. In fine-precision mode, the output calibrator adjusts the calibration value by a fine step value during each calibration operation, the fine step value being smaller than the coarse step value. By this operation, the output calibrator achieves both the fast initial convergence of a coarse-mode system, and the reduced quantization error of a fine-precision system. Also, the transition from coarse-precision mode to fine-precision mode is transparent from a system configuration perspective. Accordingly, system programming for issuing the initial set of calibration operations may be set to support coarse-mode initialization, and need not be modified for dynamic-precision devices. Accordingly, many of above-described complications relating to legacy support for lower-precision devices and support for hybrid systems that include both lower-precision devices and dynamic-precision devices are avoided.

Figure 3:
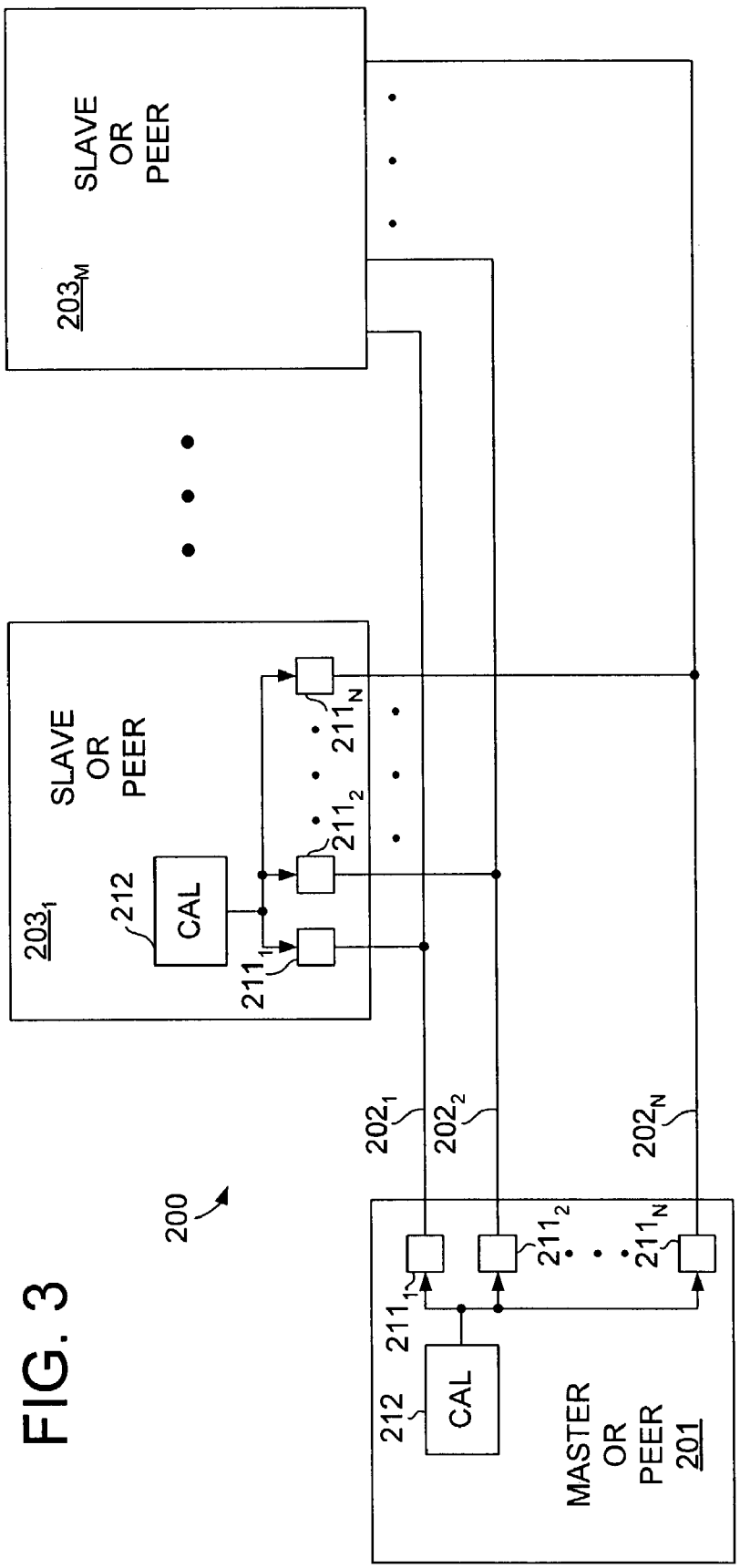
FIG. 3 illustrates a signaling system in which dynamic-precision output calibrators according to embodiments of the invention may be used.

FIG. 3 illustrates a signaling system 200 in which dynamic-precision output calibrators according to embodiments of the invention may be used. In one embodiment, the signaling system is a master-slave system having a master integrated circuit device 201 and one or more slave integrated circuit devices $203_1$–$203_M$ coupled to one another through a multi-drop bus structure formed by lines $202_1$–$202_N$. Examples of such systems include memory systems in which the master device is a memory controller, and the slave devices are memory devices; I/O bus systems (e.g., Industry Standard Architecture (ISA) bus systems; extended ISA (EISA) bus systems; peripheral component interconnect (PCI) bus systems, etc.) in which one device operates a master for a given transaction and another device as slave for that transaction, and any other system in which devices are controlled and/or respond to master device commands. In an alternative embodiment, the signaling system 200 may be a peer-to-peer system in which the devices 201 and 203 are peers (i.e., each device is capable of initiating communications with at least one other of the devices of its own volition), and arbitration logic (not shown) is provided to allocate control of the bus to the different peer devices. In yet other systems, point-to-point links between the integrated circuit devices 201, 203 may be used instead of the multi-drop bus, each device $203_1$–$203_M$ being coupled to device 201 via a separate, dedicated set of signaling lines.

Still referring to FIG. 3, each of the devices includes a number of input/output (I/O) circuits $211_1$–$211_N$ coupled to transmit and receive signals from one or more others of the devices via the signaling lines that form the multi-drop bus or point-to-point links. In one embodiment, an output calibrator 212 is provided within each of the devices 201 and $203_1$–$203_M$ to calibrate the signaling levels generated by each of the I/O circuits $211_1$–$211_N$ within the device. The output calibrator 212 may generate a single calibration value that is supplied to all the I/O circuits $211_1$–$211_N$ within the device (i.e., device-based calibration) or the calibrator may generate a respective calibration value for each individual I/O circuit 211 or each sub-group of I/O circuits 211 within the device (i.e., per-pin calibration or per-group calibration). In alternative embodiments, multiple output calibrators 212 may be provided within each device, each calibrator supporting calibration of an individual I/O circuit 211 or a sub-group of the I/O circuits 211.

Figure 4:
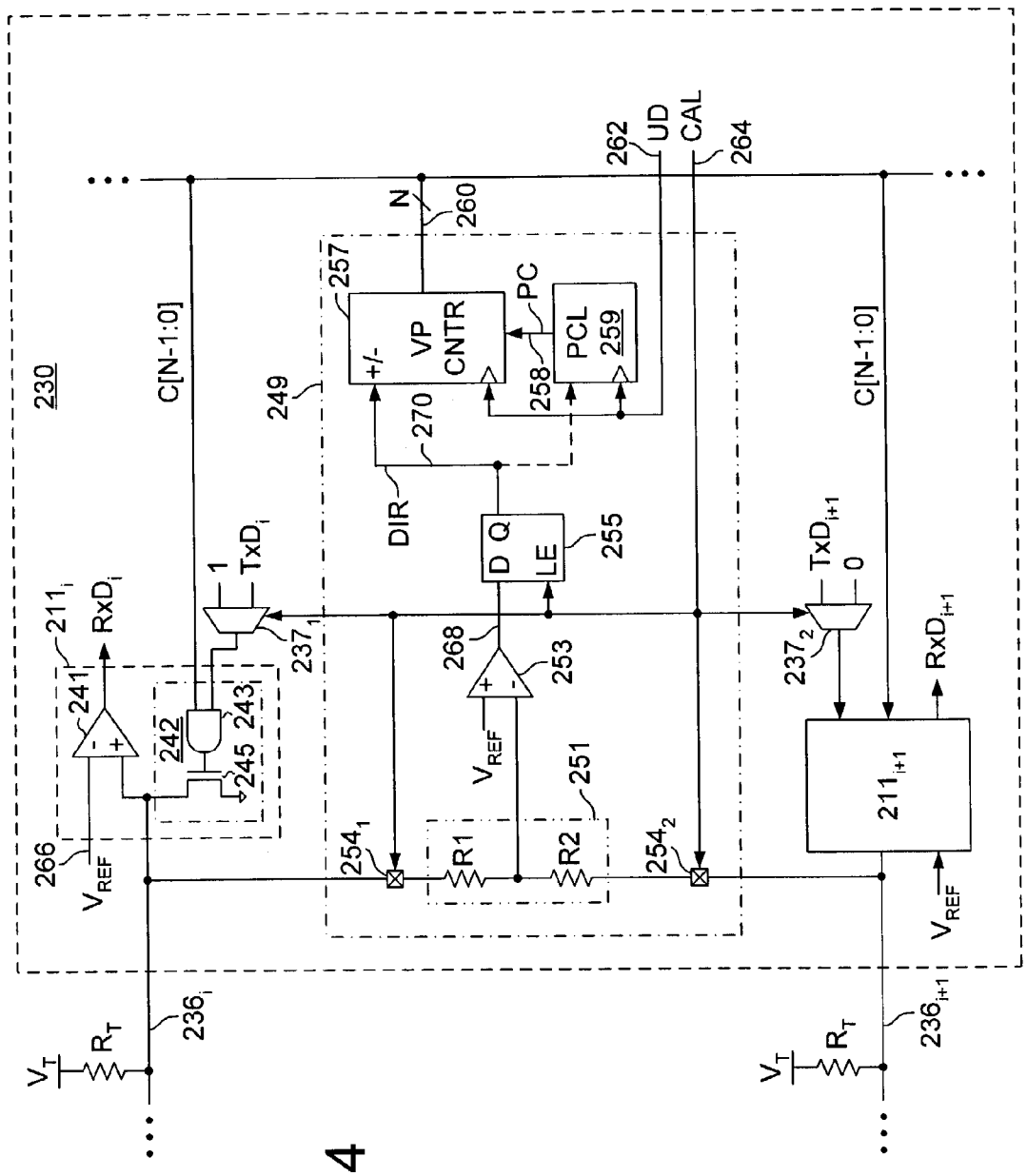
FIG. 4 illustrates an integrated circuit device that includes a dynamic-precision output calibrator according to an embodiment of the invention.

FIG. 4 illustrates an integrated circuit device 230 that includes a dynamic-precision output calibrator 249 according to an embodiment of the invention. The integrated circuit device 230 additionally includes I/O circuits $211_i$ and $211_{i+1}$ and may include numerous other circuit blocks not shown in FIG. 4 including, without limitation, additional I/O circuits 211, application circuitry for generating transmit data (TxD) and for processing receive data (RxD), and control circuitry for responding to commands from a remote device and/or other circuits within the integrated circuit device 230.

In the embodiment of FIG. 4, each of the I/O circuits $211_i$, $211_{i+1}$ is coupled to a respective external signal line $236_i$, $236_{i+1}$ that is pulled up to a termination voltage $V_T$, through a termination resistance, $R_T$. In a binary signaling implementation, each of the I/O circuits 211 includes a variable-strength, pull-down type transmit circuit 242 that draws current from the external signal line 236 at one of two levels, $I_{OL}$ or $I_{OH}$, according to the state of TxD, the data bit to be transmitted. (Note that more than two current levels may be used to achieve multi-bit per symbol signaling). For example, in a specific implementation, the transmit circuit 242 draws current $I_{OL}$ to transmit a '1', pulling the external signal line 236 down to a low output voltage level of $V_{OL}=V_T-R_T \times I_{OL}$; and draws nominally zero current to transmit a '0' ($I_{OH}\approx 0$) so that the external signal line 236 is charged to high output voltage level $V_{OH}=V_T$. The termination voltage, $V_T$, and termination resistance, $R_T$, are specified to provide a nominal $V_{OH}$-to-$V_{OL}$ signal swing that is centered about a reference voltage, $V_{REF}$. That is, ($V_{OH}+V_{OL}$)/2 is nominally equal to $V_{REF}$. By using this signaling protocol and by providing the reference voltage, $V_{REF}$, to each device within the signaling system, a receive circuit 241 within the I/O circuit 211 may compare the state of the signal line 236 with $V_{REF}$ to distinguish an incoming data value as being either a '1' or a '0'. Thus, when an I/O circuit $211_i$ within a remote device pulls the signal line $236_i$ low to transmit a '1', the receive circuit 241 within the I/O circuit $211_i$ detects the low state of the signal line $236_i$ through comparison with $V_{REF}$ and, accordingly, outputs a '1' as the receive data value, $RxD_i$. Similarly, when a remote device enables the signal line $236_i$ to charge to $V_T$ to transmit a '0', the receive circuit 241 detects the high state of the signal line $236_i$ through comparison with $V_{REF}$ and outputs a '0' as the receive data value, $RxD_i$.

Due to process variations and run-time changes in voltage and temperature, the transmit circuits 241 within different integrated circuit devices 230 in a signaling system, or even within different I/O circuits 211 within the same integrated circuit device, tend to exhibit different $I_{OL}$ values and therefore different voltage margins between $V_{OL}$ and $V_{REF}$. Left uncompensated, such process, voltage and temperature effects may attenuate the difference between $V_{OL}$ and $V_{REF}$ to the point that intolerable rates of signaling errors occur. To avoid such problems, a calibration value 260 (C[N−1:0]) generated by the dynamic-precision output calibrator 262 is provided to each transmit circuit 242 to control the current level, $I_{OL}$, and therefore to enable calibration of the $V_{OL}$ level. In one embodiment, the constituent bits of the calibration value are ANDed with the transmit data value, $TxD_i$, combinatorial circuit 243 and applied to a switching circuit 245.

Figure 5:
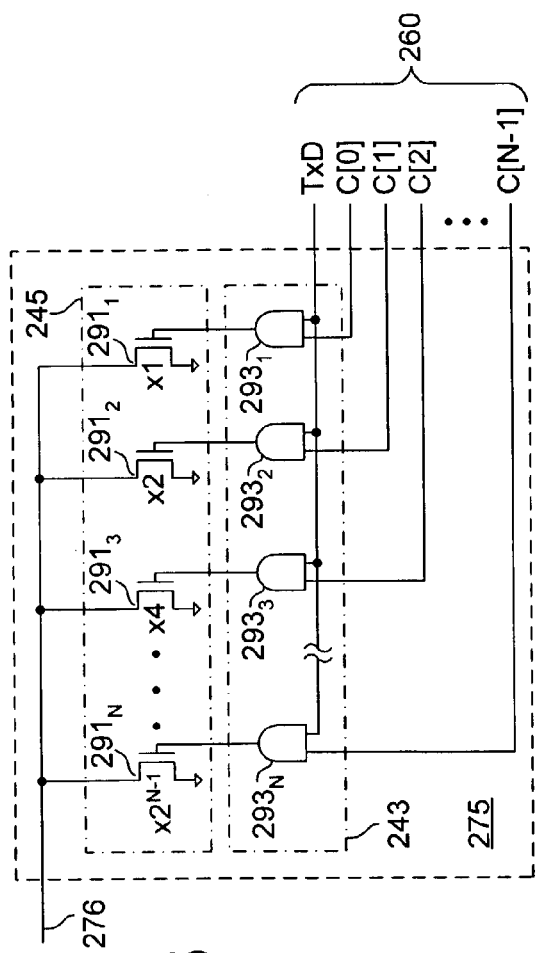
FIG. 5 illustrates a pull-down type, variable-strength transmit circuit that may be used to implement the transmit circuit of FIG. 4.

FIG. 5 illustrates a pull-down type, variable-strength transmit circuit 275 that may be used to implement the transmit circuit 242 of FIG. 4. The transmit circuit 275 includes a switching circuit 245 formed by N transistors, $291_1$–$291_N$ coupled in parallel between an output node 276 and a reference voltage (ground in this example). In the embodiment of FIG. 5, the transistors are binary weighted such that, when switched on, each transistor $291_i$ draws twice the current of transistor $291_{i−1}$ (e.g., the on-current drawn by transistor $291_2$ is twice the on-current drawn by transistor $291_1$). In alternative embodiments, different weighting schemes may be used (e.g., linear weighting, other logarithmic weightings, etc.). Also, the weightings of the different transistors may be achieved through transistor sizing (e.g., varying the width/length ratio from transistor to transistor), ganged transistors (e.g., two 'x1' transistors in parallel to form a 'x2' transistor), or other techniques for controlling the transconductance of the transistors. Further, while a pull-down type output driver is depicted in FIGS. 4 and 5, push-pull type drivers (i.e., that source current in one state and sink current in another state) may be calibrated by the dynamic-precision calibrator in alternative embodiments. In general, the output driver calibrated by the dynamic-precision output calibrator 249 of FIG. 4 may be any type of output driver that generates an adjustable voltage and/or current level on an output signal line.

The transmit circuit 275 additionally includes N logic AND gates $293_1$–$293_N$, each having a first input coupled to receive a transmit data value (TxD), a second input coupled to a respective bit of the calibration value 260, and an output coupled to the gate terminal of a respective one of the transistors $291_1$–$291_N$. By this arrangement, when the transmit data value is high, the transmit circuit 275 sinks a current $I_{OL}=C*I_{UNIT}$, where C is the numeric value of the calibration value (0 to N−1) and $I_{UNIT}$ is the on-current drawn by transistor $291_1$. Accordingly, the current level, $I_{OL}$, and therefore the output voltage level, $V_{OL}$, is a substantially linear function of the calibration value. Other relationships between the calibration value and the output voltage and current levels may be achieved through different transistor weightings.

Returning to the integrated circuit device 230 FIG. 4, in one embodiment, the transmit circuits 242 within the I/O circuits 211 are calibrated at system startup through an initial sequence of calibration operations and thereafter through periodic calibration operations to compensate for drift caused by changes in voltage and temperature. Each calibration operation is controlled by a sequence of commands and includes a compare phase to determine whether the calibration value is to be incremented or decremented, and an update phase in which the calibration value is incremented or decremented according to the determination of the compare phase. Other calibration protocols may be used in alternative embodiments.

The dynamic-precision output calibrator 249 includes switches $254_1$ and $254_2$, voltage divider 251, comparator 253, storage element 255, variable-precision counter 257 and precision control logic 259. When a calibrate command (or sequence of calibrate commands) is generated or received within the integrated circuit device 230, a calibrate signal 264 is asserted to enable the compare-phase of a calibration operation. The calibrate signal 264 is supplied to the select inputs of a pair of transmit data multiplexers $237_1$ and $237_2$, to switches $254_1$ and $254_2$, and to a latch enable input (LE) of the storage element 255. The multiplexers $237_1$ and $237_2$ respond to the calibrate signal by selecting '0' and '1' values to be applied at the transmit data inputs of the I/O circuits $211_i$ and $211_{i+1}$, respectively, instead of transmit data values $TxD_i$ and $TxD_{i+1}$. By this operation, I/O circuit $211_i$ draws current $I_{OL}$, pulling signal line $236_i$ down to $V_{OL}$, and I/O circuit $211_{i+1}$ draws substantially zero current, enabling signal line $236_{i+1}$ to charge to $V_{OH}$ (i.e., $V_T$). Switches $254_1$ and $254_2$, which may be implemented, for example, by pass-gate transistors, are switched to a conducting state by assertion of the calibrate signal 264, enabling the voltage differential between $V_{OH}$ and $V_{OL}$ to be applied to the voltage divider circuit 251. In one embodiment, the voltage divider circuit 251 is implemented by a pair of resistive elements, R1 and R2, so that a compare voltage $((V_{OH}−V_{OL})*R1)/(R1+R2)$ is produced at an inverting input of the comparator 253. When the values of R1 and R2 are equal, the compare voltage is the common mode between the high and low output levels on signal lines $236_i$ and $236_{i+1}$. That is, the compare voltage is the common mode voltage $(V_{OH}−V_{OL})/2$. Although the values of R1 and R2 may be selected (or programmatically selectable) to provide other fractional multipliers in alternative embodiments, R1 and R2 are assumed to be equal for purposes of illustration. The reference voltage, $V_{REF}$, is supplied to a non-inverting input of the comparator 253 so that the comparator 253 outputs a result signal 268, that indicates whether the reference voltage is greater than or less than the common mode voltage. Collectively, the voltage divider 251 and comparator 253 may be viewed as a compare circuit for comparing $V_{OL}$, with a voltage level formed by dividing $V_{REF}$ by the fractional multiplier of the divider circuit and subtracting $V_{OH}$ (i.e., $[(V_{REF}*(R1+R2)/R1)−V_{OH}]$.

In the embodiment of FIG. 4, the storage element 255 is a latch having a data input to coupled to receive the result signal 268 from the comparator 253, a data output coupled to provide a direction signal 270 to the variable-precision counter 257, and the aforementioned latch enable input coupled to receive the calibrate signal 264. When the calibrate signal 264 is asserted (e.g., to a logic high state), the storage element 255 operates in a pass-through mode (i.e., transparent mode), passing the state of the result signal 268 to the data output to provide the direction signal 270. When the calibrate signal 264 is deasserted, marking the end of the compare phase of a calibration operation, the level of the direction signal 270 is latched at the data output of the latch such that subsequent changes in the result signal 268 do not affect the direction signal 270. Other types of storage elements may be used to capture the state of the result signal 268 in alternative embodiments.

The variable-precision counter 257 includes an up/down input (+/−) coupled to receive the direction signal 270 from the storage element 255, a strobe input coupled to receive an update signal 262 (UD), and a precision input coupled to receive a precision control value 258 (PC) from the precision control logic 259. During the update phase of a calibration operation, the update signal 262 is asserted to increment or decrement an internal count value within the variable-precision counter 257 according to the state of the direction signal. The count value is output from the variable-precision counter 257 as the calibration value 260. The size of the increment or decrement performed by the variable-precision counter 257 in each update phase is controlled by the precision control value 258. In one embodiment, the precision control value is implemented by a single precision control bit which selects between coarse-precision and fine-precision modes of the variable-precision counter 257. In the coarse-precision mode, one or more of the least significant bits (LSBs) of the variable-precision counter are bypassed in each update phase such that the calibration value is incremented or decremented by $2^X$ in response to each assertion of the update signal, X being the number of bypassed LSBs. In the fine-precision mode, all the bits of the variable-precision counter are enabled to participate in increment and decrement operations such that the calibration value is incremented or decremented by one in response to each assertion of the update signal 262. As discussed below, in alternative embodiments of the invention, the precision control value is a multi-bit value that enables selection of more than two modes of precision within the variable-precision counter 257.

Still referring to FIG. 4, the precision control logic 259 includes a strobe input to receive the update signal 262 and, optionally, a direction input to receive the direction signal 270. At each transition of the update signal 262 (i.e., rising and/or falling edge), the precision control logic outputs an updated precision control value 258 to the variable-precision counter 257. In one embodiment, referred to herein as a transition detecting embodiment, the precision control logic 259 generates the precision control value 258 based on the current and historical states of the direction signal 270. In an alternative embodiment, the precision control logic 259 initially outputs the precision control value 258 in a coarse-precision state (i.e., state to select coarse-precision mode within the variable-precision counter 257), then transitions the precision control value 258 to a fine-precision state after a predetermined number of calibration operations have been performed.

Figure 6:
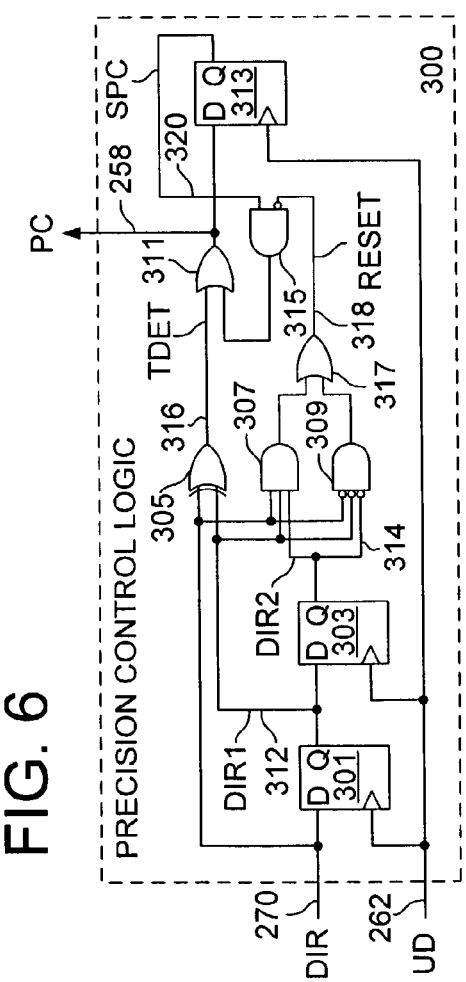
FIG. 6 illustrates a precision control logic circuit according to a transition-detecting embodiment of the invention.

FIG. 6 illustrates a precision control logic circuit 300 according to a transition-detecting embodiment of the invention. The precision control logic 300 includes storage circuits 301, 303, 313, and logic gates 305, 307, 309, 311 and 315. In the embodiment of FIG. 6, each of the storage circuits 301, 303, 313 is an edge-triggered circuit (e.g., a flip-flop) having a strobe input coupled to receive the update signal 262, and is therefore updated in response to each rising edge (or falling edge) of the update signal 262. The data input of storage circuit 301 is coupled to receive the direction signal 270, and the data input of the storage circuit 303 is coupled to the output of the storage circuit 301. Accordingly, the storage circuit 301 outputs a first delayed direction signal 312 (DIR1), that is delayed relative to the input direction signal 270, by one cycle of the update signal 262, and storage circuit 303 outputs a second delayed direction signal 314 (DIR2) that is delayed by two cycles of the update signal 262. The direction signal 270 and the first delayed direction signal 312 are provided to respective inputs of exclusive-OR logic gate 305 to generate a transition detect signal 316. Thus, if the direction signal 270 transitions prior to the transition of the update signal 262, the states of the direction signal 270 and the first delayed direction signal 312 will be different, causing the transition detect signal 316 to go high. The transition detect signal 316 is supplied to a first input of OR gate 311 which, in turn, generates the precision control value 258 (the precision control value being a single bit in the embodiment of FIG. 6).

The precision control value 258 is output from the precision control logic (i.e., for use within the variable-precision counter) and is also provided to the data input of the storage circuit 313. By this arrangement, when the transition detect signal 316 goes high, the precision control value 258 goes high and, if the precision control value remains high until the next edge of the update signal 262, the high state of the precision control value is stored in the storage circuit 313 and output as stored precision control value 320 (SPC). The stored precision control value 320 is supplied to a non-inverting input of AND logic gate 315 which additionally receives, at an inverting input, a reset signal 318. Consequently, when the reset signal is low (a non-reset condition), the stored precision control value 320 is passed to the second input of the OR logic gate 311. Thus, when the reset signal 318 is low, the storage circuit 313, AND logic gate 315 and OR logic gate 311 operate to maintain the high state of precision control value 258, even if the transition detect signal 316 goes low. The direction signal 270 and delayed direction signals 312 and 314 are each input to respective inputs of AND logic gate 307 and to respective inverting inputs of AND logic gate 309. The outputs of the AND logic gates 307 and 309 are coupled, in turn, to respective inputs of the OR logic gate 317 to produce the reset signal 318. By this arrangement, if the states of the delayed direction signals 312 and 314 and the direction signal 270 all match (i.e., all three signals low or all three signals high), the reset signal 318 is asserted to reset the precision control value 311 to the low state. Thus, the precision control logic 300 transitions the precision control value 258 to a high state in response to a transition in the input direction signal 270, and resets the precision control value to a low state in response to non-transition of the direction signal 270 for more than two cycles of the update signal. As discussed below, the reset operation of the precision control logic 300 is provided to enable an output calibrator to drop out of a fine-precision mode during an initial sequence of calibration operations if an initialized state of the delayed direction signal 312 produces a premature selection of fine-precision mode.

Figure 7:
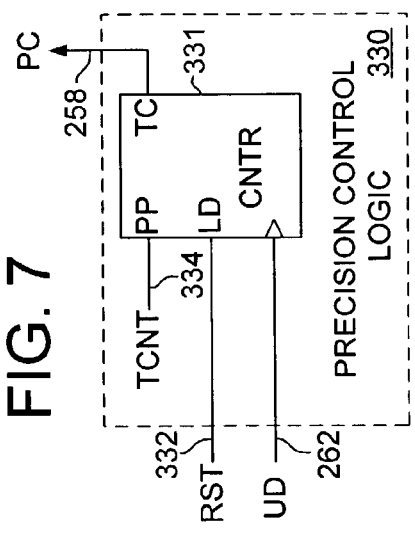
FIG. 7 illustrates a precision control logic circuit according to an embodiment that transitions a precision control value to a fine-precision state after a predetermined number of calibration operations have been performed.

FIG. 7 illustrates a precision control logic circuit 330 according to an embodiment that transitions the precision control value 258 to a fine-precision state (e.g., high state) after a predetermined number of calibration operations have been performed. The precision control logic 330 includes a pre-loadable counter 331 having a strobe input coupled to the receive the update signal 262, a load control input (LD), a parallel port (PP), and a terminal count output (TC). During system initialization, a reset signal 332 is asserted at the load input of the counter 331, causing a target count value 334 (TCNT) to be loaded into the counter 331 via the parallel port. In one embodiment, the target count value 334 is a predetermined value set via hard-wired implementation or via a one-time programming operation (e.g., fusible circuitry or similar one-time programmable circuitry being configured to provide the desired target count value 334). In an alternative embodiment, the target count value 334 is programmed within the integrated circuit device (e.g., by writing the value into a configuration register or other storage circuit within the integrated circuit device 230 of FIG. 4) by a host device, such as a master device or other control device. In either case, once the target count value 334 is loaded into the counter 331, the counter 331 counts up (or down) in response to each edge of the update signal 262 until a terminal count is reached. When the terminal count is reached, the counter transitions the state of the precision control value 258 (i.e., from low to high). Thus, the precision control logic 330 initially outputs a precision control value 258 in a low state to select the coarse-precision mode of the output calibrator, then, after a predetermined number of update signal assertions (marking a predetermined number of calibration operations), the precision control logic 330 transitions the precision control value 258 to a high state to select the fine-precision mode of the variable-precision counter. In the case of an up-counting embodiment, the counter 331 counts up from a predetermined initial count (e.g., zero), and transitions the precision control value 258 when the target count value 334 is reached. In a down-counting embodiment, the counter counts down from the target count value 334 to a predetermined terminal count value (e.g., zero), transitioning the precision control value 258 when the terminal count value is reached.

Figure 8:
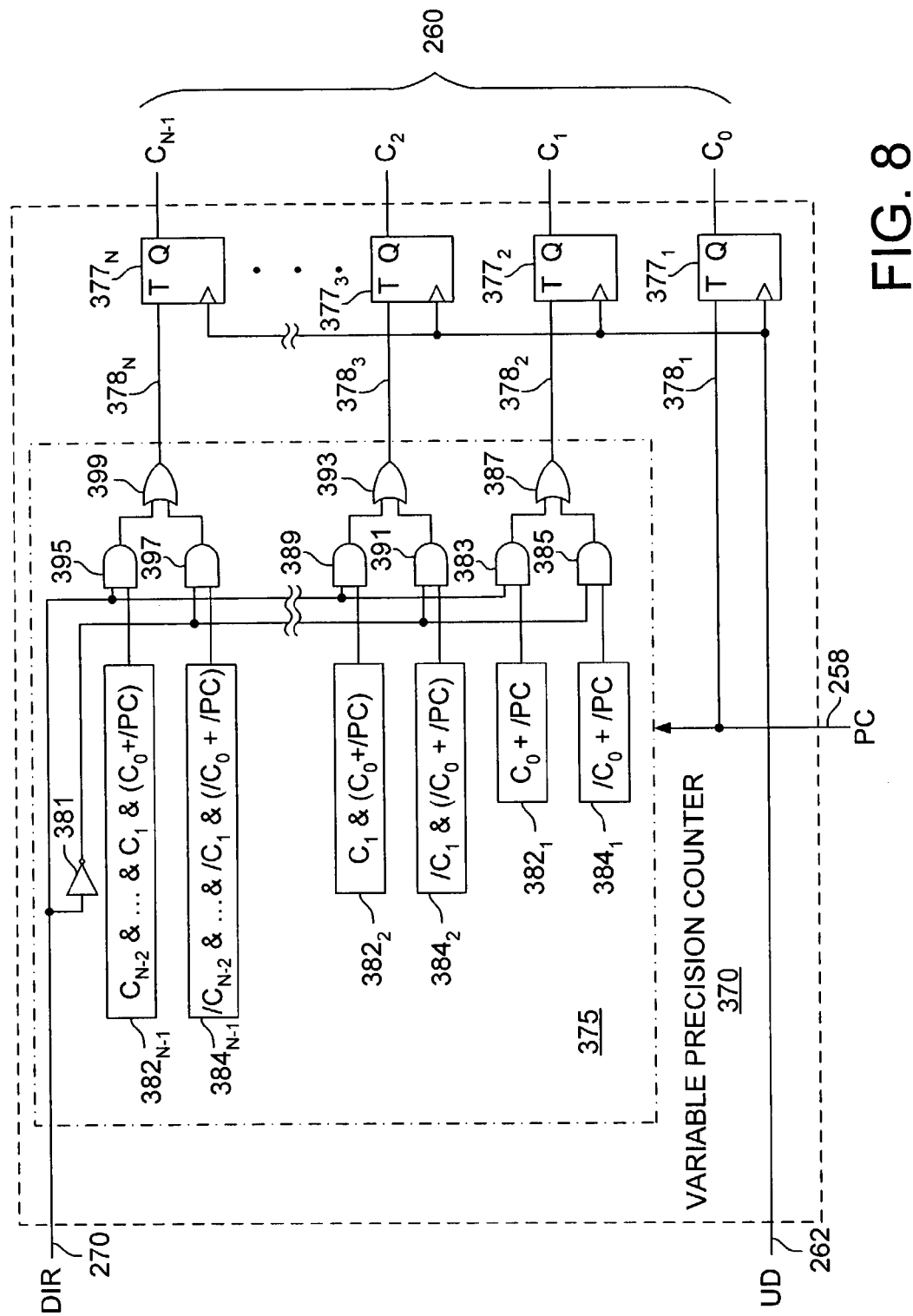
FIG. 8 illustrates a variable-precision counter according to an embodiment of the invention.

FIG. 8 illustrates a variable-precision counter 370 according to an embodiment of the invention. The counter includes N storage elements $377_1$–$377_N$ and a toggle control circuit 375, and receives the direction signal 270, update signal 262 and precision control value 258 as inputs. In the embodiment of FIG. 8, each of the N storage elements $377_1$–$377_N$ is an edge-triggered toggle element having a strobe input coupled to receive the update signal 262, a toggle input to receive a respective one of toggle signals $378_1$–$378_N$, and an output to output a respective bit of the calibration value 260 (i.e., C[N−1:0]). Other types of storage elements may be used in alternative embodiments (e.g., latches).

At each rising (or falling) edge of the update signal 262, the bit maintained within a given one of the toggle elements 377 is held constant if the corresponding toggle signal 378 is low, and toggled (i.e., switched from '1' to '0' or vice versa) if the corresponding toggle signal 378 is high. The precision control value 258, constitutes the toggle signal $378_1$ for toggle element $377_1$, and the toggle control circuit 375 generates the toggle signals $378_2$–$378_N$ for toggle elements $377_2$–$377_N$ according to the state of the precision control value 258, the direction signal 270 and the current state of the calibration value 260. More specifically, when the precision control value 258 is high, selecting a fine-precision mode within the counter 370, toggle element $377_1$ is enabled to toggle the least significant bit of the calibration value 260 in every update cycle (i.e., every rising or falling edge of the update signal 262), and each of toggle elements $377_2$–$377_N$ is enabled to toggle its respective bit of the calibration value according to the state of less significant bits of the calibration value 260 and the direction signal 270. For example, if the direction signal 270 and precision control value 258 are both high, indicating fine-precision increment operation, then toggle signal $378_2$ is asserted by operation of increment circuit $382_1$ and logic gates 383 and 387 to toggle calibration bit C[1] if calibration bit C[0] is high; toggle signal $378_3$ is asserted by operation of increment circuit $382_2$ and logic gates 389 and 393 to toggle calibration bit C[2] if calibration bits C[1] and C[0] are high; and so forth to toggle signal $378_N$ which is asserted by operation of increment circuit $382_{N-1}$ and logic gates 395 and 399 to toggle calibration bit C[N−1] if calibration bits C[N−2], CN−3 . . . C[2], C[1] and C[0] are all high. Similarly, if the direction signal 270 is low and the precision control value 258 is high, indicating a fine-precision decrement operation, then toggle signal $378_2$ is asserted by operation of decrement circuit $384_1$ and logic gates 381, 385 and 387 to toggle calibration bit C[1] if calibration bit C[0] is low; toggle signal $378_3$ is asserted by operation of decrement circuit $384_2$ and logic gates 381, 391, and 393 to toggle calibration bit C[2] if calibration bits C[1] and C[0] are low; and so forth to toggle signal $378_N$ which is asserted by operation of decrement circuit $384_{N-1}$ and logic gates 381, 397 and 399 to toggle calibration bit C[N−1] if calibration bits C[N−2], CN−3 . . . C[2], C[1] and C[0] are all low. Note that the '+' and '&' symbols in the Boolean expressions within increment circuits 382 and decrement circuits 384 represent logic OR and AND operations, respectively.

When the precision control value 258 is low, selecting the coarse-precision mode, toggle element $377_1$ is disabled from toggling C[0], and the C[0] contribution to the logic for generating toggle signals $378_2$–$378_N$ is effectively canceled by the expressions (C[0]+/PC) and (/C[0]+/PC). That is, C[0] is bypassed in the increment circuits 382 and decrement circuits 384 when the precision control value is low. Accordingly, bit C[1] of the calibration value is toggled in each update cycle, and bits C[2] through C[N−1] are toggled according to the states of less significant bits of the calibration value, excluding the bypassed bit, C[0].

It should be noted that numerous changes may be made to the variable-precision counter 370 in alternative embodiments. For example, while the precision control value 258 is used to selectively bypass a single LSB in the embodiment of FIG. 8, the precision control value may be used to bypass two or more of the LSBs in an alternative embodiment. That is, rather than selecting between a count-by-two coarse-precision mode, and a count-by-one fine-precision mode, the precision control signal may select a count-by-X coarse-precision mode, where X is an integer value greater than 2 and is controlled by the number of bypassed LSBs. The size of the coarse-mode increment may be fixed by hard-wired implementation (or one-time-programming) or programmable, for example, within a configuration control register of the integrated circuit device. Further, as discussed below, the variable-precision counter 370 may support more than two modes of precision in alternative embodiments, with an N-bit precision control value being used to select between the different precision modes. Also, while a specific combination of logic gates (and expressions) for generating the toggle control signals 378 has been illustrated in FIG. 8, other combinations of logic gates may be used in alternative embodiments.

Figure 9:
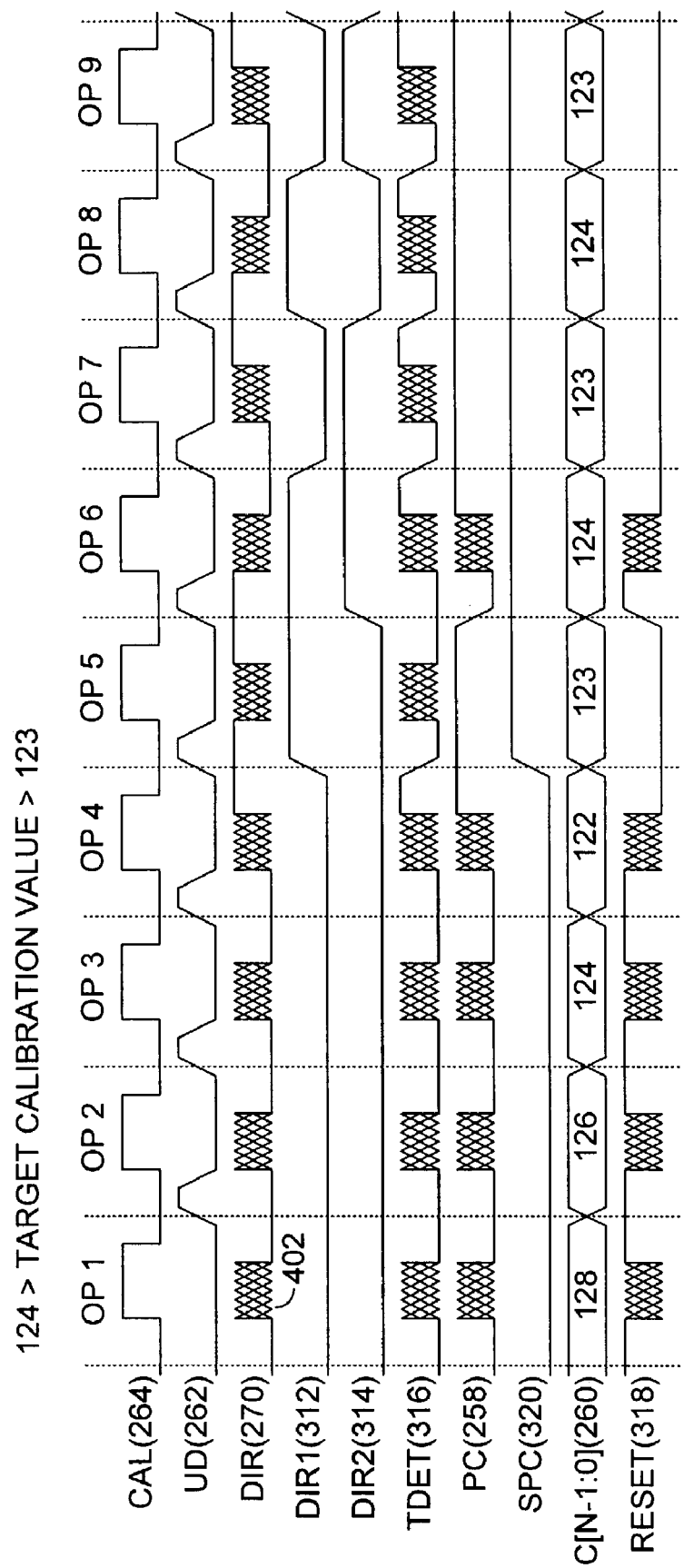
FIG. 9 is an exemplary timing diagram illustrating a sequence of calibration operations within an integrated circuit device that includes the dynamic-precision output calibrator of FIG. 4.

FIG. 9 is an exemplary timing diagram illustrating a sequence of calibration operations (OP1–OP9) within an integrated circuit device that includes the dynamic-precision output calibrator of FIG. 4. For purposes of illustration, the output calibrator is assumed to output an 8-bit calibration value and to have a 7-bit coarse-precision mode, and an 8-bit fine-precision mode. That is, in coarse-precision mode, the output calibrator increments or decrements the calibration value by two, and in fine-precision mode, the output calibrator increments or decrements the calibration value by one. Also, for purposes of illustration, the output calibrator is assumed to include the precision control logic of FIG. 6 and the variable-precision counter of FIG. 8. As discussed above, numerous other embodiments of the precision control logic and variable-precision counter may be used.

In the example of FIG. 9, for sake of illustration, the target calibration value (i.e., the ideal calibration value, if infinite precision were possible), is assumed to be bounded by calibration values 123 and 124. Also, the output calibrator is assumed to initially output a calibration value of 128 (1000

0000 binary), a value that falls roughly midway between the maximum and minimum possible calibration values, halving the search range for the target calibration value.

Each of the calibration operations, OP1–OP9, includes a compare phase marked by the high state of the calibrate signal 264, and an update phase that coincides with the rising edge of the update signal 262. Referring to FIG. 4, when the calibrate signal 264 goes high, the direction signal 270 is initially in an indeterminate state while the multiplexers 237 are switched to select the calibration data values ('1' and '0'), the switches 254 are switched on, and the compare voltage is developed at the input of the comparator 253. The indeterminate state of the direction signal 270 (shown by hashing 402) settles to a low state to indicate that the present calibration value (128) is greater than the target calibration value. Because the transition detect signal 316 is generated by an exclusive OR combination of the direction signal 270 and first delayed direction signal 312, the transition detect signal 316 is indeterminate so long as the direction signal 270 is indeterminate. Similarly, the precision control value 258 is generated by a logic OR combination of the stored precision control value 320 and the transition detect signal 316, and is therefore indeterminate so long as the transition detect signal 316 is indeterminate and the stored precision control value 320 is low. The reset signal 318 goes high whenever the direction signal 270 and both delayed direction signals 312 and 314 have the same state. Accordingly, the reset signal 318 is indeterminate so long as the direction signal 270 is indeterminate and the first and second delayed direction signals 312 and 314 have the same state.

In the embodiment of FIG. 9, the stored precision control value 320 and the delayed direction signals 312 and 314 are all initially low, so that, during calibration operation OP1, the precision control value 258 and the reset signal 318 are indeterminate during the indeterminate phase of the direction signal 270. When the direction signal 270 settles to a low state, the transition detect signal 316 settles low due to the same-state status of the direction signal 270 and delayed direction signal 312, and the precision control value 258 settles low due to the low state of the stored precision control value 320 and the low transition detect signal 316. The reset signal 318 settles at a high state due to the same-state status of the direction signal 270 and the delayed direction signals 312 and 314. The compare phase of the calibration operation OP1 is concluded when the calibrate signal 264 goes low, latching the state of the direction signal 270 in preparation for assertion of the update signal 262. The update signal 262 is asserted during an update phase that concludes the calibration operation OP1. Because the direction signal 270 and the precision control value 258 are both low at the conclusion of calibration operation OP1, a coarse-precision decrement is carried out in response to the update signal assertion, reducing the calibration value 260 by two to a value of 126. During calibration operations OP2 and OP3, the direction signal 270, delayed direction signals 312 and 314, transition detect signal 316, precision control value 258 and reset signal 318 exhibit the same states as in calibration operation OP1, resulting in the calibration value 260 being decremented by 2 to a value of 124 (conclusion of OP2) and decremented by 2 again to a value of 122 (conclusion of OP3). Because the calibration value is less than the target calibration value after calibration operation OP3, the direction signal 270 settles to a high state during the compare phase of calibration operation OP4. Consequently, the transition detect signal 316 and the precision control value 258 go high and the reset signal 318 goes low (i.e., due to the difference between the direction signal 270 and the first delayed direction signal 312). At the update signal assertion that concludes the calibration operation OP4, the high states of the precision control value 258 and direction signal 270 cause the calibration value 260 to be incremented by one to a value of 123 (i.e., a fine-precision increment). The high state of the precision control value 258 is also captured in the storage element 313 of FIG. 6, so that the stored precision control signal 320 goes high at the conclusion of calibration operation OP4. The first delayed direction signal 312 also goes high at the conclusion of calibration operation OP4 (i.e., due to the high state of the direction signal 270) and therefore causes the transition detect signal 316 to go low. During calibration operation OP5, the calibration value 260 is still below the target calibration value so that the direction signal 270 again settles to a high state. The same-state status of the direction signal 270 and the first delayed direction signal 312 causes the transition detect signal 316 to settle low, but the precision control value 258 remains high due to the high state of the stored precision control value 320. The reset signal 318 remains low during calibration operation OP5 due to the difference between the first and second delayed direction signals 312 and 314. Thus, when the update signal 262 is asserted at the conclusion of calibration operation OP5, the calibration value 260 is incremented by one to a value of 124 due to the high direction signal 270 and the high precision control value 258. The second delayed direction signal 314 also goes high at the conclusion of OP5 (i.e., due to the high state of the first delayed direction signal 312), and therefore causes the reset signal 318 to transition to a high state. Because the calibration value of 124 is greater than the target calibration value, the direction signal 270 settles to a low state during calibration operation OP6, and therefore causes the transition detect signal 316 to go high and the reset signal 318 to eventually settle low. Accordingly, the precision control value 258 is high and the direction signal 270 is low when the update signal 262 is asserted to conclude calibration operation OP6, thereby causing the calibration value 260 to be decremented by one to a value of 123. The calibration value 260 is now dithering about the target calibration value.

During calibration operation OP7, the direction signal 270 returns to the high state, causing the transition detect signal 316 to go high. The stored precision control value 320 remains high and, due to the differences between the first and second delayed direction signals 312 and 314 (and between the direction signal 270 and the first delayed direction signal 312), the reset signal 318 remains low. Accordingly, the precision control value 258 remains high during calibration operation OP7 so that, when the update signal is asserted, the calibration value 260 is incremented by one to a value of 124. During calibration operation OP8, the direction signal 270 returns to the low state, again causing the transition detect signal 316 to go high. The stored precision control value 320 remains high, and the reset signal 318 remains low. Consequently, the precision control value 258 is high when the update signal 262 is asserted at the conclusion of calibration operation OP8, causing the calibration value 260 to again be decremented to 123. The signal patterns during calibration operation OP9 mirror those of calibration operation OP7, and subsequent calibration operations mirror the results of OP8 and OP9, resulting in a fine-precision dithering about the target calibration value. If the target calibration value drifts slowly, the output calibrator will track the drift through fine-precision increments or decrements of the calibration value. A sudden, discontinuous shift in the target calibration value that results in the direction signal 270 being asserted in the same direction for three or more cycles of the update signal, will result in a transition to the coarse-precision mode, stepping by two, until the next calibration operation in which the direction signal changes state. Also, if the initial state of the delayed direction signal 312 does not match the first determination of the direction signal (i.e., as when the target calibration value is greater than 128), the output calibrator will temporarily enter fine-precision mode, but then drop back to coarse-precision mode due after both delayed direction signals 312 and 314 go high to match the high state of the direction signal 270.

Figure 10:
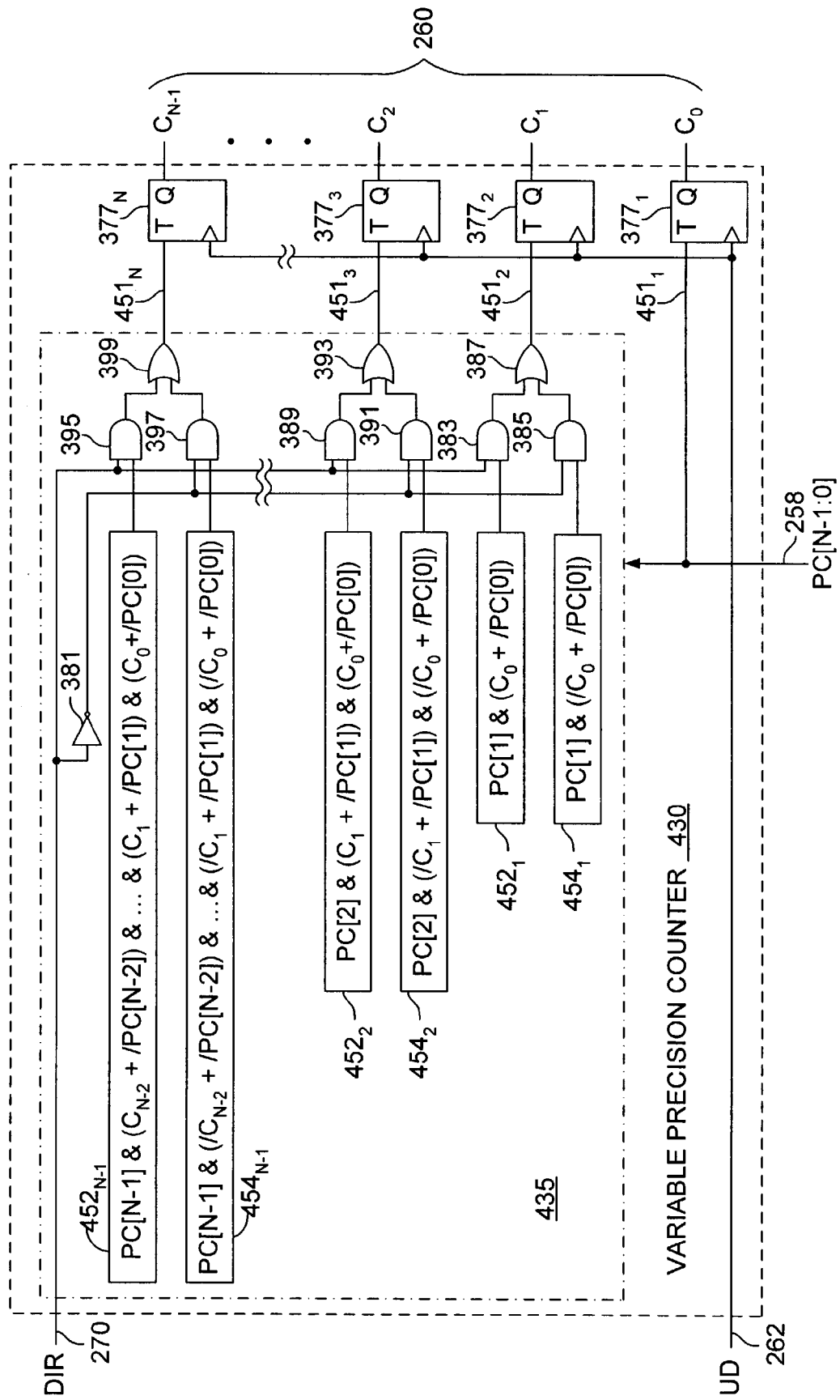
FIG. 10 illustrates an embodiment of a variable-precision counter having N different levels of precision that are selected by an N-bit precision control value.

FIG. 10 illustrates an embodiment of a variable-precision counter 430 having N different levels of precision that are selected by an N-bit precision control value 258. The variable-precision counter 430 includes toggle elements $377_1$–$377_N$ and a toggle control circuit 435, and receives the direction signal 270 and update signal 262 as inputs, along with the N-bit precision control value 258. The toggle elements 377 operate generally as described in reference to FIG. 8 to maintain an N-bit calibration value 260, and the toggle control circuit 435 includes logic gates 383, 385, 387, 389, 391, 393, 395, 397 and 399 that operate generally as described in reference to FIG. 8 to generate toggle control signals $451_1$–$451_N$. That is, the direction signal 270 is provided to a first input of each of logic AND gates 383, 389 and 395, and the complement of the direction signal (generated by inverter 381) is provided to a first input of logic AND gates 385, 391 and 397. Increment circuits $452_1$–$452_{N-1}$ are coupled respectively to the second inputs of the AND gates 383, 389 and 395, and counterpart decrement circuits $454_1$–$454_{N-1}$ are coupled respectively to the second inputs of the AND gates 385, 391 and 397. Each of the increment and decrement circuits 452, 454 is disabled from generating a high output unless a corresponding bit of the precision control bit is high. For example, the outputs of increment circuit $452_1$ and decrement circuit $454_1$ are forced low if PC[1] is low; the output of increment circuit $452_2$ and decrement circuit $454_2$ are forced low if PC[2] is low, and so forth to the outputs of increment circuit $452_{N-1}$ and decrement circuit $454_{N-1}$, which are forced low if PC[N] is low. The remaining logic within each of the increment circuits 452 operates to assert the corresponding one of toggle signals 451 if all the less significant bits of the calibration value 260 are either '1' or bypassed due to a low state of the corresponding bit of the precision control value 258. Similarly, the remaining logic within each of the decrement circuits 454 operates to assert the corresponding toggle signal 451 if all the less significant bits of the calibration value 260 are either '0' or bypassed due to a low state of the corresponding bit of the precision control value 258. For example, if PC[1] is high and the direction signal 270 is high, then increment circuit $452_1$ will produce a high toggle signal $451_1$ if C[0] is high, or if PC[0] is low (i.e., PC[0] being low to bypass C[0]). Similarly, if PC[1] is high and the direction signal 270 is low, then decrement circuit $454_1$ will drive toggle signal $454_1$ high if C[0] is low or if PC[0] is low. Table 1 below illustrates the size of the step (increment or decrement) selected by different values of an exemplary 8-bit precision control value 258. Precision control values having more or fewer bits may be used in alternative embodiments.

TABLE 1

| PC[7:0] | Step Size |
|---------|-----------|
| 1111 1111 | 1 |
| 1111 1110 | 2 |
| 1111 1100 | 4 |
| 1111 1000 | 8 |
| 1111 0000 | 16 |
| 1110 0000 | 32 |
| 1100 0000 | 64 |
| 1000 0000 | 128 |

Still referring to FIG. 10, in one embodiment, the precision control value 258 is transitioned between different values in response to transitions in the direction signal 270. In an alternative embodiment, the precision control value 258 is transitioned between different values in response to determining that a predetermined number of calibration operations have been performed. Other types of events may be used to provoke precision transitions in alternative embodiments. Also, the different precision control values 258 selected in response to transition events may be programmatically selected, for example by a configuration setting stored within a configuration circuit of the integrated circuit device.

FIG. 11 illustrates a binary search for a target calibration value using the variable-precision counter of FIG. 10. For purposes of example, an eight-bit calibration value and an eight-bit precision control value are assumed. The calibration and/or precision control value may have more or fewer bits in alternative embodiments. An exemplary target calibration value between 48 and 47 is also assumed.

During a first calibration operation, an N-bit precision control value is set to 1000 0000b ('b' indicating binary) to select a step size of 128. That is all the bits of the precision control value except bit PC[7] are in a bypass state to bypass less significant bits of the calibration value (i.e., prevent the less significant bits of the calibration value from participating in an increment or decrement operation). The calibration value is initially zero, so that the direction signal will be high, which, in conjunction with the low state of precision control bits PC[6:0] and the high state of precision control bit PC[7], will cause bit C[7] of the calibration bit to be toggled to a '1'. That is, the calibration value is stepped from 0 to 128 to conclude the first calibration operation. During a second calibration operation, the calibration value is determined to exceed the target calibration value. Consequently, the direction signal goes low to select a decrement operation. The precision control value is changed to 1100 0000b, halving the size of the step applied in the previous calibration operation. The low state of precision control bits PC[5:0] and the high state of precision control bits PC[7:6] causes the value held in the most significant two bits of the calibration value, C[7:6], to be decremented from 10 to 01 at the conclusion of the second calibration operation. Overall, the calibration value is halved from 128 to 64. During the third calibration operation, the direction signal is low again, so that a decrement operation is selected again. The precision control value is changed to 1110 0000b, again halving the size of the step. The low state of precision control bits PC[4:0] and the high state of precision control bits PC[7:5] causes the value held in the most significant three bits of the calibration value, C[7:5] to be decremented from 010 to 001. Overall, the calibration value is halved again from 64 to 32. During the fourth calibration operation, the direction signal goes high (i.e., the target calibration value, 48, is greater than the calibration value, 32), selecting an increment operation, and the precision control value is changed to 1111 0000b.

The low state of precision control bits PC[3:0] and the high state of precision control bits PC[7:4] causes the value held in the most significant four bits of the calibration value, C[7:4] to be incremented from 0010 to 0011. Overall the calibration value is increased by one-half from 32 to 48. During the fifth calibration operation, the direction signal goes low (the target calibration value, 47, being less than the calibration value, 48) to select a decrement operation, and the precision control value is changed to 1111 1000b. The low state of precision control bits PC[2:0] and the high state of precision control bits PC[7:3] causes the value held in the most significant five bits of the calibration value, C[7:3] to be decremented from 00110 to 00101, the overall calibration value being decreased from 48 to 40. During the sixth calibration operation, the direction signal goes high to select an increment operation, and the precision control value is changed to 1111 1100b. The low state of precision control bits PC[1:0] and the high state of precision control bits PC[7:2] causes the value held in the most significant six bits of the calibration value, C[7:2], to be incremented from 001010 to 001011, the overall calibration value being increased from 40 to 44. During the seventh calibration operation, the direction signal goes high to select an increment operation again, and the precision control value is changed to 1111 1110b. The low state of precision control bit PC[0] and the high state of precision control bits PC[7:1] causes the value held in the most significant seven bits of the calibration value, C[7:1], to be incremented by 1 from 0010110 to 0010111, the overall calibration value being increased from 44 to 46. The seventh calibration operation effectively concludes the binary search for the target calibration value. During the eighth and subsequent calibration operations, the precision control value is set to 1111 1111b, thereby enabling the variable-precision counter to increment or decrement by one during each subsequent calibration operation. Accordingly, at the conclusion of calibration operation 8, the calibration value is increased by one from 46 to 47, and at the conclusion of calibration operation 9, the calibration value is increased by one again from 47 to 48. In the calibration operations that follow the ninth calibration operation, the calibration value dithers back and forth by one about the target calibration value. Thus, the binary search converges on the target calibration value in $\log_2(X)$ calibration operations, where X is the size of the search range. In alternative embodiments, the search may include any combination of binary and linear searching, including coarse-precision stepping, followed by binary searching within a pair of bounding calibration values; binary searching to reduce the search range to a selected number of calibration values, followed by fine-precision searching, or coarse-precision and fine-precision searching; or any other search technique that involves step sizes of different precision.

Although the invention has been described with reference to specific exemplary embodiments thereof, it will be evident that various modifications and changes may be made thereto without departing from the broader spirit and scope of the invention. Accordingly, the specification and drawings are to be regarded in an illustrative rather than a restrictive sense.

What is claimed is:

1. An integrated circuit device comprising:
   an output driver circuit to output a first signal having a signal level according to a control value;
   a storage circuit to store a value that represents a number of times to adjust the control value by a first increment before reaching a transition event; and
   a control circuit coupled to receive the first signal from the output driver and to adjust the control value by a first increment until the transition event is detected, and the control circuit to adjust the control value by a second increment after the transition event is detected, wherein the second increment is smaller than the first increment.

2. The integrated circuit device of claim 1 wherein the output driver comprises a plurality of transistors coupled in parallel, each of the plurality of transistors having a control terminal coupled to receive a respective bit of the control value.

3. The integrated circuit device of claim 2 wherein the plurality of transistors includes N differently sized transistors, a largest one of the transistors having a transconductance that is substantially twice the transconductance of a second largest one of the transistors, the second largest one of the transistors having a transconductance that is substantially twice the transconductance of a third largest one of the transistors, and to a second smallest one of the transistors having a transconductance that is substantially twice the transconductance of a smallest one of the transistors.

4. The integrated circuit device of claim 1 wherein the output driver is a pull-down output driver that is switched to a first conducting state to transmit a data value having a first logic state and that is switched to a substantially non-conducting state to transmit a data value having a second logic state.

5. The integrated circuit device of claim 4 wherein the output driver is a multi-level output driver that is switched to a second conducting state to transmit a data value having a third logic state, the multi-level output driver conducting less current in the second conducting state than in the first conducting state.

6. The integrated circuit device of claim 1 wherein the output driver is a push-pull output driver that is switched to a current sinking state to transmit a data value having a first logic state and that is switched to a current sourcing state to transmit a data value having a second logic state.

7. The integrated circuit device of claim 1 wherein the control circuit comprises a compare circuit to compare the signal level of the first signal with a signal level of a first reference signal and to generate an adjust signal having either a first state or a second state according to whether the signal level of the first signal exceeds the signal level of the first reference signal.

8. The integrated circuit device of claim 7 wherein the compare circuit comprises a voltage divider circuit coupled between the output driver circuit and a signal line having a second reference level, the voltage divider circuit to generate a compare signal having a signal level that is a predetermined fraction of a voltage difference between the second reference level and the signal level of the first signal.

9. The integrated circuit device of claim 8 wherein the compare circuit further comprises a comparator to compare the signal level of the compare signal with the signal level of the first reference signal and to output a result signal having either a first state or a second state according to whether the signal level of the compare signal exceeds the signal level of the first reference signal.

10. The integrated circuit device of claim 7 further comprising a variable-precision counter coupled to receive the adjust signal from the compare circuit and to increase the control value when the adjust signal has the first state and to decrease the control value when the adjust signal has the second state.

11. The integrated circuit device of claim 10 further comprising a precision control circuit to detect the transition event, the precision control circuit to generate a precision control signal having a first state prior to detecting the transition event and a second state in response to detecting the transition event, and wherein the variable-precision counter is coupled to receive the precision control signal from the precision control circuit, the variable-precision counter to increase or decrease the control value by the first increment when the precision control signal is in the first state and to increase or decrease the control value by the second increment when the precision control signal is in the second state.

12. The integrated circuit device of claim 11 wherein the precision control circuit is coupled to receive the adjust signal from the compare circuit and to detect a transition in the precision control signal, the transition in the precision control signal constituting the transition event.

13. The integrated circuit device of claim 11 wherein the variable-precision counter increases or decreases the control value in response to a transition of an update signal.

14. The integrated circuit device of claim 13 wherein the precision control circuit comprises a transition counter to count transitions of the update signal, the transition counter to output the precision control signal in the first state until a predetermined number of transitions of the update signal have been counted, and to output the precision control signal in the second state after the predetermined number of transitions of the update signal have been counted.

15. A method of operation within an integrated circuit device, the method comprising:
   storing a value that represents a number of times to adjust a control value by a first increment before reaching a transition event;
   outputting a first signal having a signal level according to the control value;
   adjusting the control value by the first increment until the transition event is detected;
   detecting the transition event; and
   adjusting the control value by a second increment after the transition event is detected, wherein the second increment is smaller than the first increment.

16. The method of claim 15 wherein outputting a first signal having a signal level according to the control value comprises selectively switching each of a plurality of transistors to a current conducting state according to whether a respective bit of the control value is in a first state or a second state.

17. The method of claim 16 wherein each of the plurality of transistors is coupled to a precharged signal line and wherein selectively switching each of the plurality of transistors to a current conducting state comprises selectively switching each of the plurality of transistors to a current sinking state to discharge the precharged signal line.

18. The method of claim 15 wherein adjusting the control value by the first increment comprises:
   comparing the signal level of the first signal with a signal level of a first reference signal; and
   either increasing or decreasing the control value by the first increment according to whether the signal level of the first signal exceeds the signal level of the first reference signal.

19. The method of claim 18 wherein comparing the signal level of the first signal with a signal level of the first reference signal comprises:
   generating a compare signal having a signal level that is a predetermined fraction of a difference between the signal level of the first signal and a signal level of a second reference signal; and
   comparing the signal level of the compare signal with the signal level of the first reference signal.

20. The method of claim 19 wherein the second reference signal is a supply voltage.

21. The method of claim 18 wherein adjusting the control value by the first increment further comprises generating a result signal having either a first state or a second state according to whether the signal level of the first signal exceeds the signal level of the first reference signal, and wherein detecting the transition event comprises detecting a transition of the result signal from the first state to the second state or from the second state to the first state.

22. The method of claim 15 wherein adjusting the control value by the first increment comprises adjusting the control value by the first increment in response to each transition of an update signal, and wherein detecting the transition event comprises determining that a predetermined number of transitions of the update signal have occurred.

* * * * *